United States Patent
Karst et al.

(10) Patent No.: US 9,818,898 B2
(45) Date of Patent: Nov. 14, 2017

(54) METHOD FOR PRODUCING A PHOTOVOLTAIC MODULE WITH AN ETCHING STEP P3 AND AN OPTIONAL STEP P1

(71) Applicant: COMMISSARIAT A L'ENERGIE ATOMIQUE ET AUX ENERGIES ALTERNATIVES, Paris (FR)

(72) Inventors: Nicolas Karst, Folkling (FR); Charles Roger, Joue les Tours (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 161 days.

(21) Appl. No.: 14/390,426

(22) PCT Filed: Mar. 28, 2013

(86) PCT No.: PCT/IB2013/052506
§ 371 (c)(1),
(2) Date: Oct. 3, 2014

(87) PCT Pub. No.: WO2013/150423
PCT Pub. Date: Oct. 10, 2013

(65) Prior Publication Data
US 2015/0075580 A1    Mar. 19, 2015

(30) Foreign Application Priority Data
Apr. 6, 2012   (FR) .................................. 12 53200

(51) Int. Cl.
*H01L 31/046*   (2014.01)
*H01L 31/0463*  (2014.01)
(Continued)

(52) U.S. Cl.
CPC ........ *H01L 31/0463* (2014.12); *H01L 31/046* (2014.12); *H01L 31/0465* (2014.12);
(Continued)

(58) Field of Classification Search
CPC ............. H01L 31/0322; H01L 31/0323; H01L 31/0326; H01L 31/0327; H01L 31/03923;
(Continued)

(56) References Cited

U.S. PATENT DOCUMENTS 4,502,225 A   3/1985 Lin
5,436,204 A   7/1995 Albin et al.
(Continued)

FOREIGN PATENT DOCUMENTS

| EP | 0 684 652 | 11/1995 |
| KR | 2011-0037513 | 4/2011 |
| WO | 2007/056224 | 5/2007 |

OTHER PUBLICATIONS

Wuerz, et al. "Alternative sodium sources for Cu(In, Ga)Se2 thin-film solar cells on flexible substrates," Thin Solid Films 519.21 (2011): 7268-7271.*
(Continued)

*Primary Examiner* — Bethany L Martin
*Assistant Examiner* — William E McClain
(74) *Attorney, Agent, or Firm* — Clark & Brody

(57) ABSTRACT

A method for producing an intermediate product for obtaining a photovoltaic module comprising a plurality of solar cells, said method comprising the following steps: (a) localized deposition on a substrate (4) of a layer of metal (8) so as to cover at least one portion (401) of the substrate, (b) deposition on this localized layer (8) of a layer (41) of conductive material, said layer coating the localized layer (8).

5 Claims, 4 Drawing Sheets

Figure 3A:
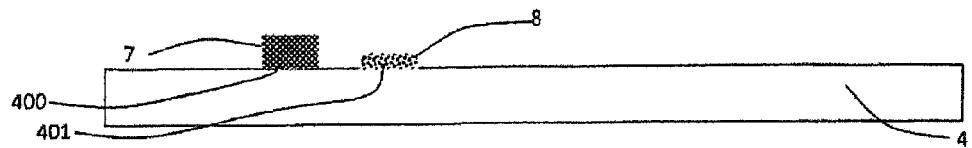

(51) Int. Cl.
*H01L 31/0465* (2014.01)
*H01L 31/18* (2006.01)
*H01L 31/0749* (2012.01)
*H01L 31/0392* (2006.01)
*H01L 31/032* (2006.01)

(52) U.S. Cl.
CPC ...... *H01L 31/1864* (2013.01); *H01L 31/0322* (2013.01); *H01L 31/03923* (2013.01); *H01L 31/0749* (2013.01); *H01L 31/1828* (2013.01); *Y02E 10/541* (2013.01)

(58) Field of Classification Search
CPC ......... H01L 31/03926; H01L 31/03928; H01L 31/0749; H01L 31/0445; H01L 31/046; H01L 31/0463; H01L 31/0465; H01L 31/18; H01L 31/186; H01L 31/1864
See application file for complete search history.

(56) References Cited

U.S. PATENT DOCUMENTS

| | | | |
|---|---|---|---|
| 5,578,503 A | 11/1996 | Karg et al. | |
| 2008/0047599 A1 | 2/2008 | Buller et al. | |
| 2009/0139573 A1* | 6/2009 | Ramasesha | H01L 21/02568 |
| | | | 136/262 |
| 2009/0145472 A1* | 6/2009 | Li | H01L 31/0465 |
| | | | 136/244 |
| 2009/0194150 A1 | 8/2009 | Aoki | |
| 2010/0000589 A1 | 1/2010 | Kiss | |
| 2010/0236606 A1 | 9/2010 | Kobayashi et al. | |
| 2010/0300526 A1 | 12/2010 | Denda et al. | |
| 2012/0103416 A1* | 5/2012 | Kwon | H01L 31/022425 |
| | | | 136/256 |
| 2012/0180869 A1* | 7/2012 | Jee | H01L 31/022425 |
| | | | 136/262 |
| 2014/0238472 A1* | 8/2014 | Shin | H01L 27/302 |
| | | | 136/251 |
| 2014/0305505 A1* | 10/2014 | Park | H01L 31/022425 |
| | | | 136/262 |
| 2015/0020864 A1* | 1/2015 | Dufourcq | H01L 31/03923 |
| | | | 136/244 |

OTHER PUBLICATIONS

Bartlome et al., "Lase applications in thin-film photovoltaics", Applied Physics B, (2010) 100:427-436.
J. Hermann et al., "Selective ablation . . . laser pulses", Applied Surface Science 252 (2006) 4814-4818.
Rekow et al., "Appilication of a . . . Micro-Processing Applications" NRC Publications Archive, 2010.
Westin et al., "Laser patterning of . . . CIGS PV modules", Solar Energy Materials & Solar Cells, 92 (2008) 1230-1235.

\* cited by examiner

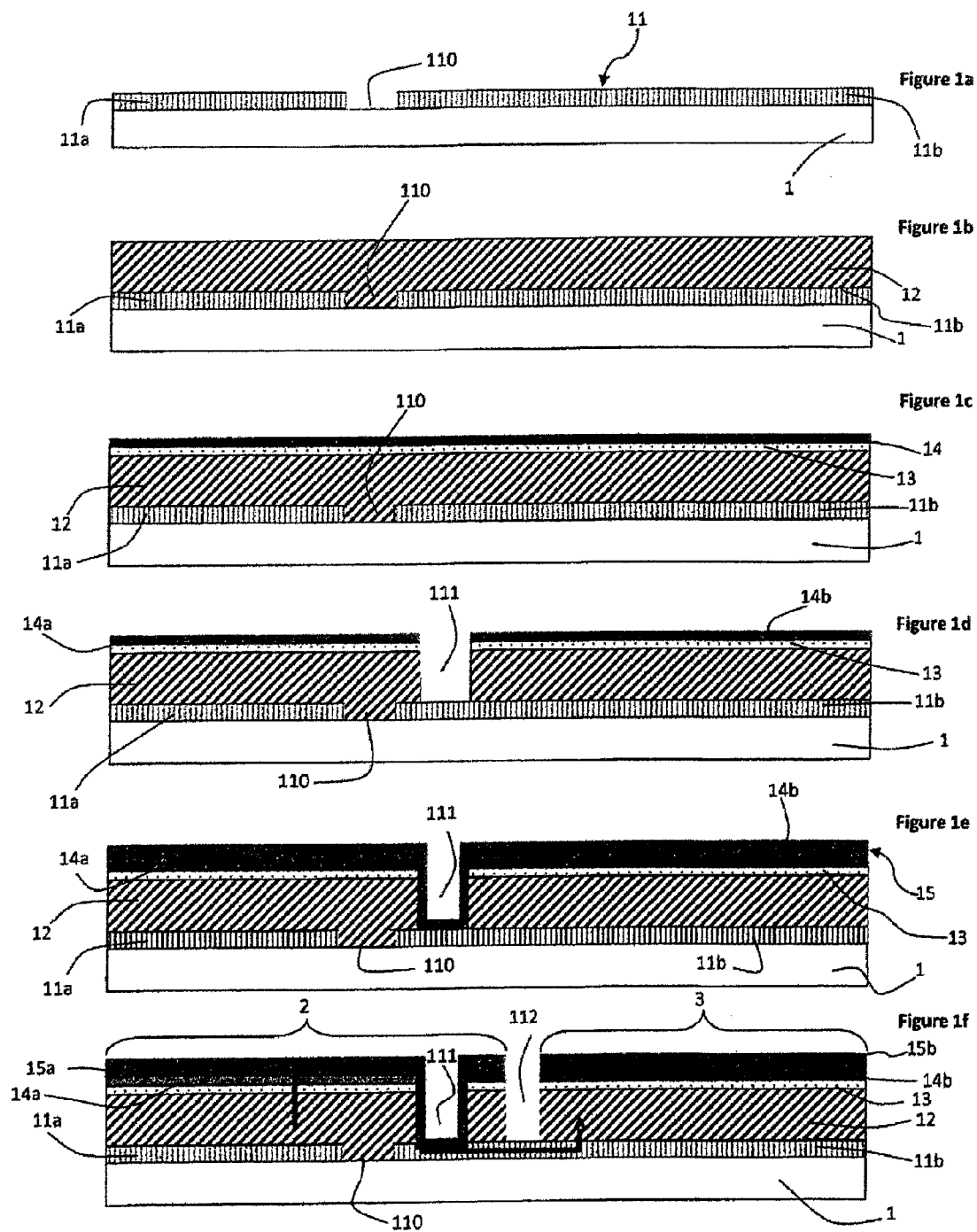

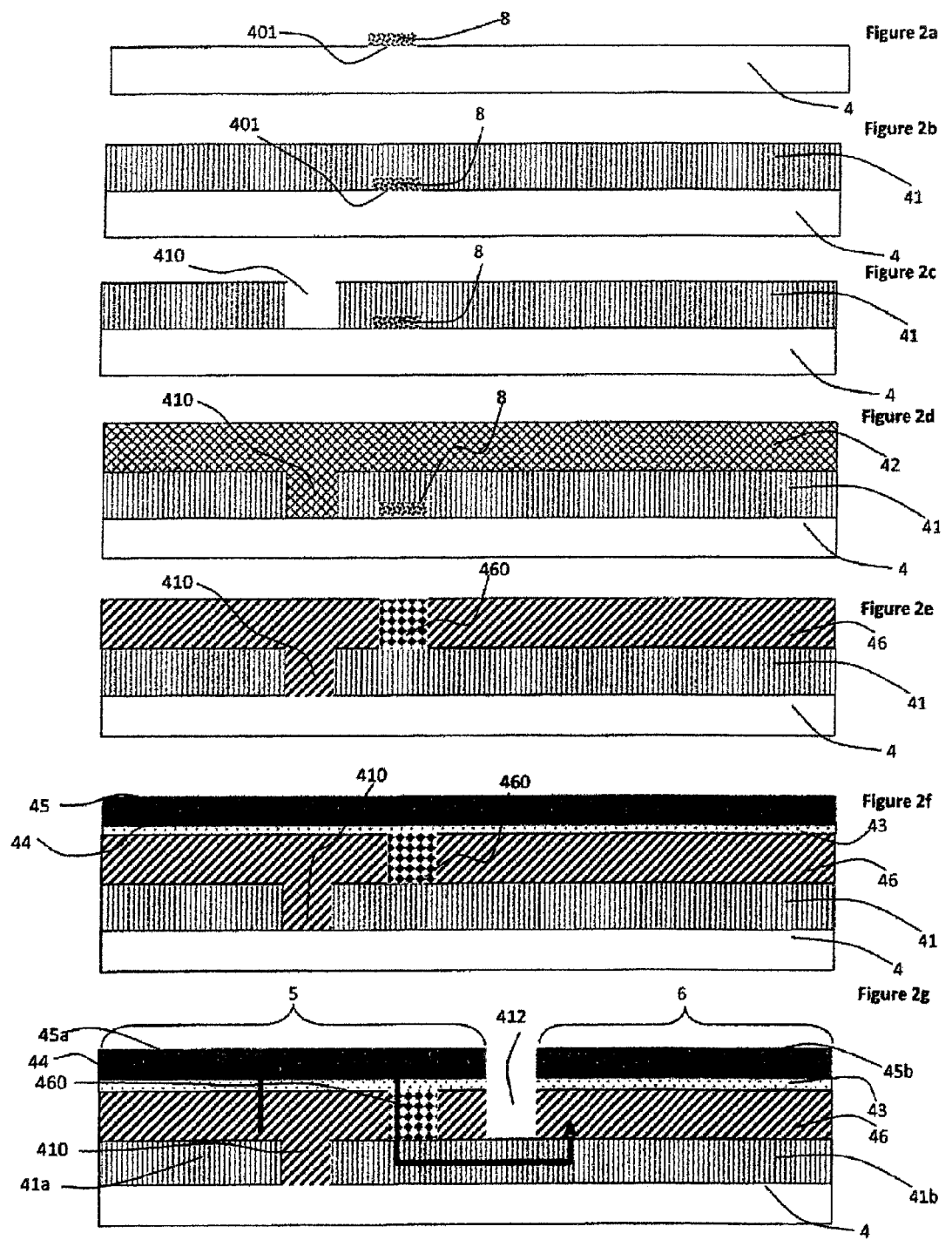

METHOD FOR PRODUCING A PHOTOVOLTAIC MODULE WITH AN ETCHING STEP P3 AND AN OPTIONAL STEP P1

The invention relates to the field of photovoltaic solar energy and more particularly to photovoltaic modules in the form of thin layers.

Within the framework of the present patent application, a "thin layer" will be a layer exhibiting a thickness of less than 5 µm.

A photovoltaic module comprises several solar cells placed in series. Indeed, the electrical voltage generated across the terminals of a single solar cell, less than 1 volt, is in general too low for many devices. It is therefore necessary for many cells to be placed in series. Thus, the voltage delivered by a photovoltaic module is of the order of 100 volt, for some hundred cells linked in series.

For photovoltaic modules in the form of thin layers, this series placement can be obtained by steps of etching and of deposition carried out on one and the same substrate. A monolithic interconnection is thus produced. This exhibits a considerable advantage with respect to the conventional technology of bulk crystalline silicon. Indeed, the production of modules made of crystalline silicon requires unwieldy and laborious wire connection and soldering operations. All these operations are rendered irrelevant with thin layer technology.

The method of monolithic interconnection of solar cells in the form of thin layers requires three etching steps, conventionally dubbed P1, P2, P3.

The first step (P1) ensures the electrical insulation of two adjacent cells at the level of the rear-face electrode of the solar cells.

The second step (P2) makes it possible to connect the front-face electrode of a given cell to the rear-face electrode of the adjacent cell.

The third step (P3) consists in electrically isolating two adjacent cells at the level of the front-face electrode.

Various techniques are implemented to carry out this monolithic interconnection method.

The most conventional are mechanical etching or laser ablation.

It is thus possible to refer to document U.S. Pat. No. 4,502,225 which describes a device comprising an etching tip intended for semi-conducting devices.

Laser use in thin-layer solar cells is in particular described in the articles "*Selective ablation of thin films with short and ultrashort laser pulses*", Hermann et al., Appl. Surf. Sci. 252 (2006) 4814 or else "*Laser applications in thin-film photovoltaics*", Bartolme et al., Appl Phys B 100 (2010) 427-436.

These etching techniques exhibit the advantage of being able to be employed for a wide variety of materials deposited in thin layers, such as for example CdTe, a-Si, CZTS (of general formula $Cu_2ZnSn(S,Se)_4$) or CIGS (of general formula $Cu(In, Ga)(S, Se)_2$).

However, these etching techniques each exhibit drawbacks.

Thus, mechanical etching leads to damage to the materials on account of the presence of mechanical stresses on the layers, to the formation of debris on the surface of the layers in proximity to the etching line which may lead to problems of short-circuiting, as well as to the wearing of the etching tips. Moreover, generally, the quality of mechanical etching is very sensitive to many parameters such as the morphology or the properties of the thin layers, as well as to the operating parameters of the etching tips.

Moreover, laser ablation is not simple to implement. Indeed, it may be noted that the material removed may melt and partly clog up the groove produced by the laser ablation. Thus, this technique does not make it possible to obtain a clean surface necessary for producing good quality electrical contact.

It is also possible to use chemical etching processes. However, these processes are more complicated and more expensive to implement than the conventional processes of mechanical etching or laser ablation.

In order to better pinpoint the context of the invention, a conventional method of monolithic interconnection for a photovoltaic module in the form of thin layers will now be described with reference to FIGS. 1a to 1f. All these figures are sectional views and represent various steps of implementation of this method.

FIG. 1a represents a substrate 1 which can be made of diverse materials, in particular glass, or else flexible or rigid plastic or metal (for example steel, aluminum, or titanium).

In general, this substrate is made of soda-lime glass whose thickness is a few millimeters and typically between 1 and 3 mm.

On this substrate 1 is deposited a molybdenum layer 11 whose thickness is generally between 100 nm and 2 µm, and preferably of the order of 1 µm.

This molybdenum layer will serve to constitute the rear-face electrode of the various cells forming the photovoltaic module.

FIG. 1a shows that an etching step is carried out after the deposition of the Mo layer. As indicated previously, this etching is generally carried out, either mechanically, or by laser ablation. It leads to the formation of a groove 110, devoid of molybdenum.

This groove 110 makes it possible to define the rear face electrodes 11a and 11b of the adjacent cells 2 and 3 illustrated in FIG. 1f.

This etching step corresponds to step P1 mentioned previously.

The width of the groove 110 is generally between 10 µm and 100 µm, and it is preferably of the order of 50 µm.

FIG. 1b illustrates another step of the method in which there is produced a photovoltaic layer and, by way of example, a crystallized CIGS layer. This layer has a light-absorbing function.

This step consists firstly in introducing, on the rear face electrode 11, metallic precursors of Cu, In, Ga, and elements of type Se and/or S, serving for the growth of the layer of CIGS, p-type semiconductor.

Numerous deposition methods suitable for thin layers can be used.

These may be vacuum methods, such as cathodic evaporation or sputtering or methods implemented at atmospheric pressure, such as electrodeposition, silk-screen printing, doctor-blading, ink-jet or slit-coating.

Thus, precursors of Cu, In and Ga can be deposited by cathodic sputtering. A layer of Se and/or S can thereafter be deposited on the obtained stack by a vacuum process or a process implemented at atmospheric pressure.

Generally, a bulk introduction of S or Se is always necessary. The chalcogen S or Se can be introduced in the form of elementary gas, in the form of gas ($H_2S$ or $H_2Se$) or in the form of a layer of evaporated S or Se, deposited on the surface of the layer of metallic precursors.

It should be noted that the gases $H_2S$ and $H_2Se$ are highly toxic, thereby greatly complicating the use of these gases on an industrial scale.

The thickness of this layer of metallic precursors is generally between 300 nm and 1 µm.

The conversion of the constituents into a layer 12 of crystallized CIGS is performed by high-temperature annealing, dubbed selenization/sulfurization annealing, using a temperature rise ramp of between 1° C./s and 10° C./s.

It is in particular possible to refer to document U.S. Pat. No. 5,578,503 which describes a method for obtaining a semiconductor of the type $CuXY_2$ where X is In and/or Ga and Y is Se or S.

This method comprises an annealing with a fast heating step with a temperature ramp of at least 10° C./s so as to attain a temperature of greater than or equal to 350° C., this temperature being thereafter maintained for a duration of between 10 seconds and 1 hour.

The temperature is generally between 400 and 600° C.

The layer of constituents can be covered with a cap, preferably made of graphite. This cap makes it possible to ensure a greater partial pressure of Se and/or S during annealing, thereby leading to an increase in the diffusion of Se and/or S in the metallic precursors.

It is also possible to refer to document U.S. Pat. No. 5,436,204 which describes a method comprising three steps: a first step of depositing indium and/or gallium at a temperature of between 350 and 500° C., a second step of depositing copper in which the temperature is increased to attain a higher recrystallization temperature of between 500 and 600° C., and a third step of depositing indium and/or gallium in which this higher temperature is maintained. It should be noted that the whole of this method is carried out in a selenium and/or sulfur atmosphere.

FIG. 1c shows another step of implementation of the method, in which a n-type semiconductor layer 13 is deposited on the layer of CIGS, so as to form the pn junction.

This layer can be deposited by chemical bath, by cathodic sputtering or else by evaporation.

It may for example be composed of CdS and deposited by chemical bath, the layer 13 exhibiting a thickness of a few tens of nm.

Other materials can be used such as ZnS or Zn(O,S), for a thickness for example of between 5 nm and 30 nm.

FIG. 1c also illustrates another, optional, step of the method. This step consists in depositing a layer 14 of intrinsic ZnO, whose function will be explained further on.

This layer 14 is highly transparent in the solar spectrum and highly resistive. It is generally deposited by cathodic sputtering and exhibits a thickness of a few tens of nm.

It may be noted that the layer 13 prevents reactions between the ZnO and the CIGS and thus protects the layer 12, during deposition of the layer 14.

FIG. 1d illustrates a step of implementation of the method in which another etching is carried out, either mechanically, or by laser ablation.

This etching, corresponding to step P2 mentioned above, consists in removing all the layers previously deposited on the molybdenum layer 11. This etching therefore makes it possible to produce an opening referenced 111 in FIG. 1d. It will make it possible to produce a part (P2) of the electrical interconnection between two adjacent cells.

The width of the opening 111 is generally between 50 µm and 150 µm and it is preferably equal to about 100 µm.

Moreover, the distance between the openings 110 and 111 is generally between 50 µm and 150 µm and it is preferably equal to about 100 µm.

FIG. 1e illustrates yet another step of implementation of the method, in which a layer of a conducting transparent oxide 15 is deposited.

This layer can be deposited by cathodic sputtering and exhibit a thickness of a few hundred nm.

It may in particular be Al-doped ZnO, exhibiting a thickness of about 500 nm.

This layer of Al-doped ZnO will serve to form a conducting transparent electrode referenced 15a for the front face electrode of the cell 2 and 15b for the front face electrode of the cell 3 (see FIG. 1f).

It is generally admitted that the n-type semiconductor layer 13 may exhibit discontinuities. The function of the layer 14 of ZnO is then to ensure electrical insulation between the conducting layer 15 and the layer 12 of CIGS.

Other materials, such as the tin-doped indium oxide (ITO), silver nanowires, carbon nanotubes could also be employed to produce this conducting transparent electrode. Likewise, other deposition techniques could also be used.

It is understood that the distance between the openings 110 and 111 must be great enough to avoid too great an interconnection resistance between the front face electrode 15a of the cell 2 and the rear face electrode 11b of the cell 3.

FIG. 1f illustrates a last step of the method, in which another etching is carried out in the stack of layers so as to definitively insulate the cell 2 from the cell 3.

This etching step corresponds to step P3 mentioned above. It can be carried out mechanically or by laser ablation and consists in removing all the layers deposited on the rear face electrode 11b.

The opening 112 obtained makes it possible to electrically isolate the two cells 2 and 3 at the level of their front face electrodes 15a and 15b.

The opening 112 more generally exhibits a width of between 10 µm and 200 µm, and it is preferably of the order of 100 µm.

FIG. 1f also illustrates the path of the charges between the two adjacent cells 2 and 3.

Thus, the front face electrode 15a of the first cell 2 makes it possible to collect at the front face the electrical charges generated in this cell 2 and to convey them to the rear face electrode 11b of the adjacent cell 3.

Having regard to the drawbacks exhibited by the conventional etching techniques, solutions have been proposed in the prior art.

They relate to step P2 and their object is to locally increase the conductivity of the CIGS material so as to carry out the conduction of the charges from the front face electrode of a given cell to the rear face electrode of the adjacent cell.

This may involve a laser treatment making it possible for the CIGS to be afforded a metallic behavior locally. It is in particular possible to refer to the article by Westin et al., "*Laser patterning of P2 interconnect via thin-film CIGS PV modules*", Solar Energy Materials and Solar Cells 92 (2008) 1230.

Thus, the laser treatment makes it possible to create a zone of greater conductivity than the remainder of the CIGS layer which replaces the direct contact between the layer of Al-doped ZnO and the molybdenum rear-face electrode.

However, the lasers that are able to render the CIGS conducting are different from those used to etch it, in the course of step P3. It is in particular possible to refer to the article "*Application of a Pulse Programmable Fiber Laser to a Broad Range of Micro-Processing Applications*", Rekow et al., NRC publications archives. Thus, two types of laser are then necessary, thereby considerably increasing production costs.

Metallic precursors deposited locally on the rear-face electrode can also play this role by diffusing in the CIGS layer, during the growth of the latter at high temperature, thus ensuring conduction paths between the rear-face electrode of a cell and the front-face electrode of the adjacent cell. It is in particular possible in this regard to refer to document US-2010/0000589. However, since the metallic precursors are deposited on the rear-face electrode, made for example of molybdenum, they will be sensitive to the oxidation resulting from the formation of the CIGS layer. This oxidation may bring about the modification of the desired effect, namely to render the CIGS locally conducting, thereby rendering the envisaged method ineffective.

The object of the invention is to alleviate the drawbacks of the prior art by proposing another method making it possible to ensure the electrical contact between the front-face electrode of a solar cell and the rear-face electrode of the adjacent cell, while avoiding the need to carry out mechanical, laser or chemical etching.

Thus, the invention relates firstly to a method for producing an intermediate product for obtaining a photovoltaic module comprising a plurality of solar cells, this method comprising the following steps:
(a) the localized deposition of a metal layer on a substrate, so as to cover at least one part of the substrate,
(b) the deposition, on this localized layer, of a layer of conducting material, this layer coating the localized layer.

In a variant, during step (a), a layer of a material of the type Se or S is also deposited locally on the substrate, so as to cover at least one part of the substrate, distinct from said at least one part covered with metal.

The invention also relates to a method for obtaining a photovoltaic module comprising a plurality of solar cells in a structure in the form of thin layers, which structure successively comprises a substrate, a rear-face electrode, a photovoltaic layer obtained by annealing on the basis of metallic precursors and a semiconductor layer, in which:
- an intermediate product is produced in accordance with the method according to the invention, the layer of conducting material forming the rear-face electrode, and
- on completion of the annealing leading to the obtaining of the photovoltaic layer, a zone exhibiting a greater conductivity than the remainder of the photovoltaic layer is formed in the photovoltaic layer.

The method therefore makes it possible to avoid the implementation of an etching of type P2.

In another mode of implementation, the method according to the invention consists in producing the intermediate product in accordance with the variant according to the invention, according to which, during step (a), a layer of a material of the type Se or S is also deposited locally on the substrate, so as to cover at least one part of the substrate, distinct from said at least one part covered with a metal.

In this case, another annealing step is carried out, which modifies said localized layer of material of the type Se or S, so as to form, in the rear-face electrode, a zone exhibiting a greater resistivity than the remainder of the rear-face electrode, this zone ensuring the electrical insulation between two adjacent cells of the photovoltaic module.

In this other mode of implementation, the method according to the invention also makes it possible to avoid the implementation of an etching step of the type P1.

In a first variant, the annealing step is carried out before the obtaining of the photovoltaic layer, with a temperature ramp of less than or equal to 1° C./s and at a temperature of between 225 and 300° C., for a duration of between 1 and 5 min, said zone of the rear-face electrode being formed of a material resulting from the reaction of the conducting material with Se or S.

In other variants, the annealing step is carried out during the obtaining of the photovoltaic layer, at a temperature of between 400 and 650° C., with temperature rise ramps of strictly greater than 1° C./s and possibly as much as 15° C./s.

Thus, in a second variant, said zone is formed of photovoltaic material.

In a third variant, said zone is a groove.

The invention also relates to a photovoltaic module comprising a plurality of solar cells connected in series on a common substrate, each cell comprising a front face electrode, transparent to light, and a rear face electrode, spaced apart from the front face electrode by a photovoltaic layer and a semiconductor layer making it possible to create a pn junction with the photovoltaic layer, in which the front face electrode of a cell is connected electrically to the rear face electrode of the adjacent cell, by way of a zone made of conducting material of the photovoltaic layer.

In another embodiment, the photovoltaic module according to the invention also comprises, in the rear face electrode and between two adjacent cells, a zone exhibiting a greater resistivity than the remainder of the rear-face electrode, this zone electrically insulating the rear face electrodes of said two adjacent cells.

In a first variant, said zone of greater resistivity is formed of a material resulting from the reaction of the conducting material of the rear face electrode with an element picked from Se and S.

In a second variant, this zone is formed of photovoltaic material.

In a third variant, this zone is a groove.

The invention also relates to an intermediate product for obtaining a photovoltaic module according to the invention, comprising successively on a substrate, a localized metal layer and a layer of conducting material coating this localized layer.

The intermediate product making it possible to obtain the other embodiment of the photovoltaic module according to the invention also comprises, on the substrate, a localized layer of material of the type Se or S, distinct from the localized metal layer.

Figure 3B:
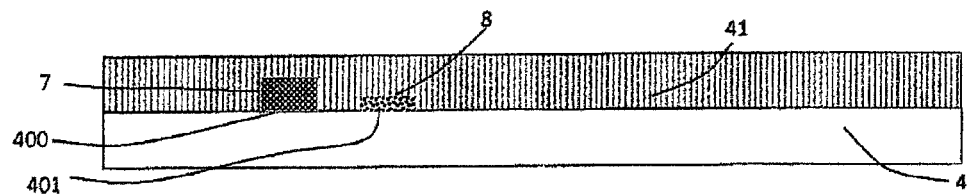
Figure 3C:
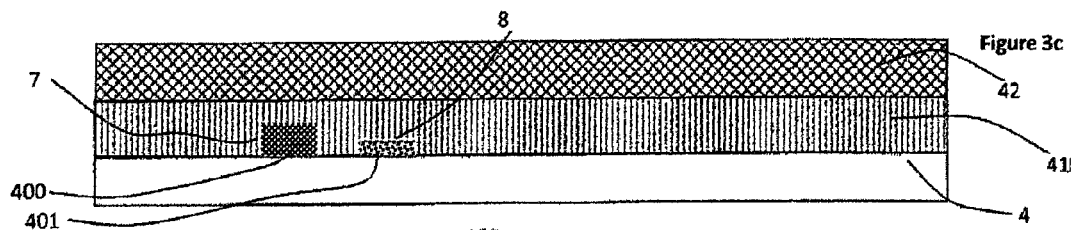
Figure 3D:
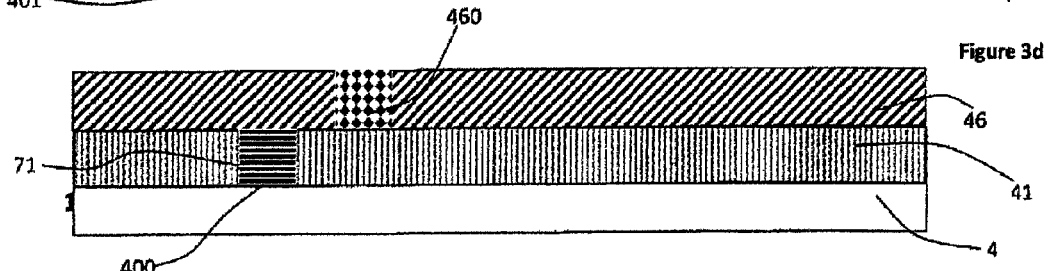
Figure 3E:
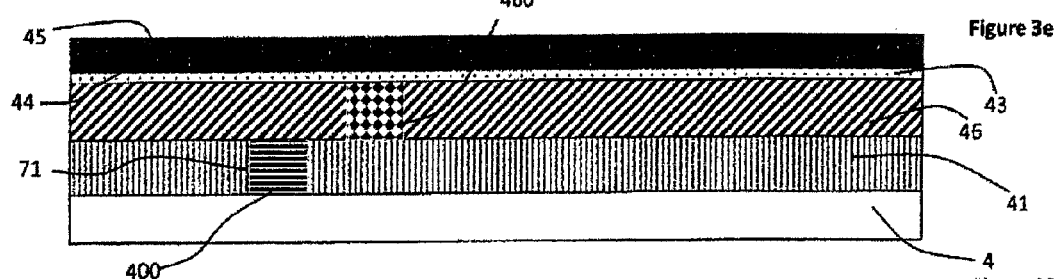
Figure 3F:
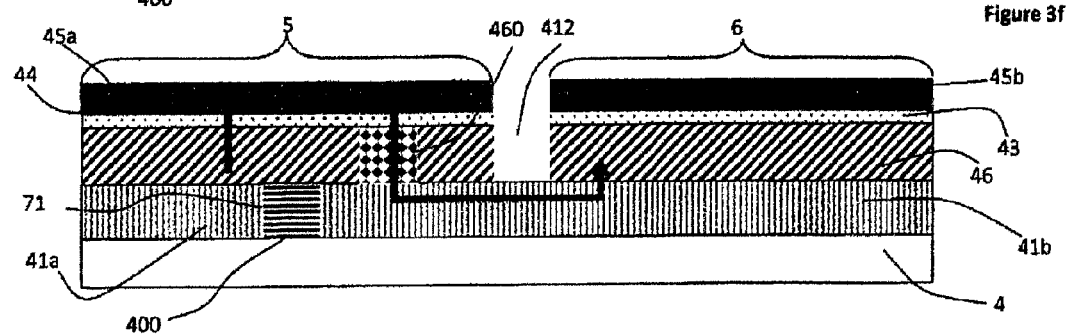
Figure 4:
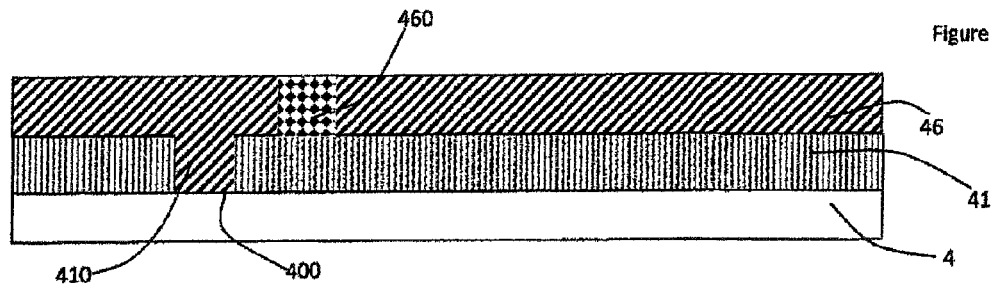
Figure 5:
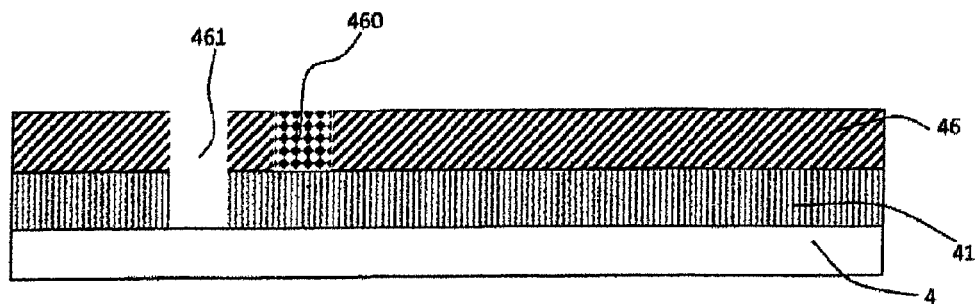
Figure 6:
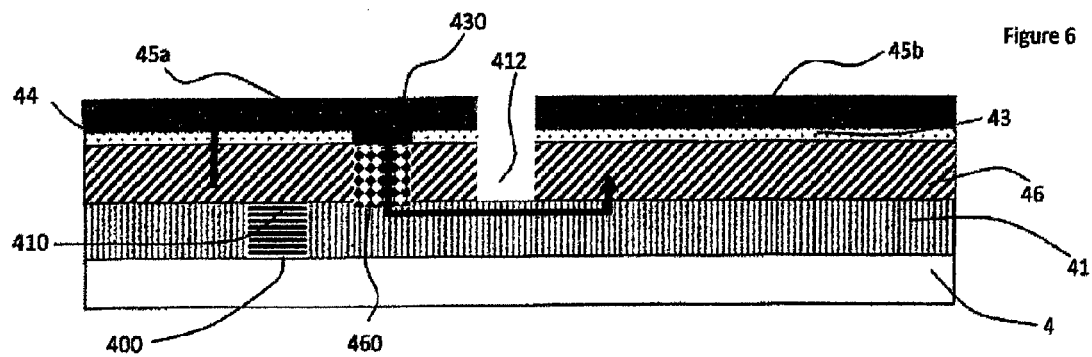

The invention will be better understood and other aims, advantages and characteristics of the latter will be more clearly apparent on reading the description which follows and which is given in regard to the appended drawings in which:

FIGS. 2a to 2g represent various steps of implementation of the method according to the invention, FIGS. 3a to 3f, represent various steps of implementation of another method according to the invention, FIGS. 4 and 5 are variants of a step of the method according to the invention, corresponding to FIG. 3d, FIG. 6 illustrates a variant of another step of the method according to the invention corresponding to FIG. 3e.

All these figures are sectional views and the elements common to the various figures will be designated by the same references.

FIG. 2a represents a substrate 4 which can be made of diverse materials, conventionally glass, plastic or metal. In general, this substrate is made of soda-lime glass whose thickness is a few millimeters and, for example, 3 mm.

On this substrate is deposited a metal layer 8, in a localized manner. It is in particular copper or an alloy based on Cu and Se or Cu and S.

Thus, at least one part 401 of the substrate is covered with a metal.

FIG. 2a shows only a single metal covered part 401 of the substrate 4. Of course, several parts of the substrate will be able to be covered with metal, insofar as a plurality of photovoltaic cells are intended to be produced on the substrate 4.

Various deposition methods can be implemented to produce the localized layer 8.

Thus, this layer can be deposited by cathodic sputtering or by vacuum evaporation through a mechanical mask.

The layer 8 can also be obtained by a printing process, of the slit-coating, silk-screen printing or ink-jet type, using for example an ink based on nanoparticles of Cu, dispersed in an organic solvent.

Such a printing process is preferably used since its implementation gives rise to lower costs than those of a vacuum implementation process.

Generally, each metal covered part 401 of the substrate will exhibit a width of between 50 and 150 µm and preferably equal to 100 µm.

FIG. 2b illustrates another step of the method in which a metallic layer 41, forming a rear face electrode for the various cells of the photovoltaic module, which will be obtained by the method according to the invention is deposited on the substrate 4.

This layer 41 is continuous. Stated otherwise, it covers the substrate uniformly.

This layer is for example made of molybdenum and its thickness is between 100 nm and 2 µm and in particular equal to 500 nm.

It is possible to envisage other materials, in particular Ni, Pt, or any other conducting material depositing in columnar form and exhibiting a certain porosity.

The deposition of the metallic layer can in particular be carried out by cathodic sputtering.

It should be noted that the porosity of the layer 41 can be tailored by modifying the conditions under which the sputtering is carried out. Thus, when argon is sputtered during the deposition of molybdenum, the sputtering pressure is a parameter of the porosity obtained. It is possible in this regard to refer to the article by Bommersbach et al.: "*Influence of Mo back contact porosity on co-evaporated Cu(In, Ga)Se$_2$ thin film properties and related solar cell*" Prog. Photovolt: Res. Appl. (2011).

As shown by FIG. 2b, the metallic layer 41 coats the localized metal layer 8.

The stack illustrated in FIG. 2b constitutes an intermediate product which can be produced independently of the steps of the method which are implemented subsequently.

In practice, this intermediate product will be able to be produced by the industry fabricating the substrate 4.

FIG. 2c illustrates the etching step which is carried out after the deposition of the layer 41. As indicated previously, this etching is generally carried out, either mechanically or by laser abrasion. It leads to the formation of a groove 410 which is therefore devoid of metal.

This groove 410 makes it possible to define the rear face electrodes 41a and 41b of the adjacent cells 5 and 6 illustrated in FIG. 2g.

This etching step corresponds to step P1 mentioned above.

The width of this groove 410 is generally between 10 and 100 µm and it is preferably of the order of 50 µm.

FIG. 2d illustrates a step of the method in which the precursors, which will lead to the formation of the photovoltaic layer, are introduced in the form of a layer 42. It covers the layer 41 and fills the groove 410.

These are metallic precursors of Cu, In, Ga or else metallic precursors of Cu, Zn, Sn, and optionally at least one element picked from Se and S.

By way of example, the ratios of the elements Cu, In and Ga are conventionally chosen in such a way that:

$0.75 \leq Cu/(In+Ga) \leq 0.95$; $0.55 \leq In/(In+Ga) \leq 0.85$ and $0.15 \leq Ga/(In+Ga) \leq 0.45$.

For their part, the ratios of the elements Cu, Zn and Sn are conventionally chosen in such a way that:

$0.75 \leq Cu/(Zn+Sn) \leq 0.95$ and $1.05 \leq Zn/Sn \leq 1.35$.

This layer 42 can essentially comprise metallic precursors. In this case, the sulfur or the selenium are then introduced in gaseous form. They can also be introduced in the form of a layer deposited on the layer of metallic precursors.

Moreover, the layer 42 can comprise at one and the same time metallic precursors and selenium or sulfur.

FIG. 2e illustrates another step of the method in which at one and the same time the localized layer 8 and the layer 42 are transformed.

During this step, an annealing is carried out, by virtue of which the metallic precursors present in the layer 42 are converted into a layer 46 of photovoltaic material, for example, into CIGS or CZTS, by virtue of the introduction of selenium or sulfur.

Thus, a material of the CZTS type may in particular consist of $Cu_2Zn\,SnSe_4$, $Cu_2ZnSn\,S_4$ or $Cu_2ZnSn\,(S,\,Se)_4$, depending on whether selenium, sulphur or a mixture of the two components is introduced.

Thus, the annealing is carried out at a temperature typically of between 400 and 650° C. and, preferably, equal to 550° C. The range of values for the temperature rise ramp is between 1° C./s and 15° C./s.

In a conventional manner, the introduction of selenium or sulfur can be performed during the annealing in gaseous form or, before the annealing, during the deposition of a selenium or sulfur layer on the layer of metallic precursors or else during the deposition of the layer of metallic precursors.

In the latter case, the annealing is carried out in a neutral atmosphere.

Moreover, it is also customary to comply with a stoichiometry of Se of around 40%, since it is known that the theoretical stoichiometry of Cu (In, Ga) Se$_2$ is such that Se/Cu=2. The same applies when the metallic precursors chosen lead to the formation of CZTS.

In a conventional manner, the duration of the annealing is between 30 seconds and 30 minutes and it is, preferably, about 1 min in duration.

In this regard, reference is made to the teaching of the previously mentioned documents U.S. Pat. No. 5,578,503 and U.S. Pat. No. 5,436,204.

During the obtaining of the photovoltaic layer 46, the copper present in the localized layer 8 diffuses through the layer 41 so as to form, inside the photovoltaic layer, a zone 460 made of conducting material.

Indeed, the layer 46 locally comprises a percentage of copper greater than that present in the remainder of the photovoltaic layer. When the ratio Cu/(In+Ga) is greater than 1, this leads to the formation of compounds based on Cu and Se or S, known to be conducting. This may in particular involve compounds of the type $Cu_2Se$ or $Cu_{1.8}Se$ or of the type $Cu_2S$ or $Cu_{1.8}S$.

The thickness of the layer 42 and the quantity of copper introduced by the layer 8 will be tailored so that at the level of the zone 460, the ratio Cu/(In+Ga) is greater than 1. Thus, the zone 460 will be a mixture of CIGS and of compounds of type $Cu_2Se$ which will form localized conduction paths within the CIGS.

By way of example, when the thickness of the CIGS layer 46 is about 1.4 µm with a stoichiometry such that the ratio Cu/(In+Ga) is about 0.8, it will suffice for the thickness of the layer 8 to be about 50 nm, with a width of between 50 and 150 µm and preferably equal to 100 µm, so that the ratio Cu/(In+Ga) is greater than 1 in the zone 460.

Thus, the thickness and the width of the layer 8 will be chosen as a function of the thickness of the layer 46 and of the value of the ratio Cu/(In+Ga) in the layer 46.

So as to facilitate the diffusion of the copper through the layer 41, pressure ranges of between 2 mTorr and 15 mTorr will be able to be used to form the layer 41 by cathodic sputtering. The pressure will preferably be of the order of 10 mTorr. The porosity obtained is then of the order of 15%.

It should be noted that on completion of the annealing leading to the formation of the photovoltaic layer 46 and of the zone 460, a part of the copper of the localized layer 8 may still be present in the layer 41.

However, the presence of copper in the layer 41 does not modify the behavior of this layer, insofar as copper is a conducting material, like the remainder of the layer 41.

FIGS. 2f and 2g describe the other steps of the method according to the invention, which correspond to FIGS. 1c, 1e and 1f.

Thus, with reference to FIG. 2f, an n-type semiconductor layer 43 is deposited on the layer 46, so as to form the pn junction. As indicated in regard to FIG. 1c, the material used may be CdS, ZnS or Zn(O,S).

FIG. 2f illustrates another step of the method which consists in depositing a layer 44 of a transparent material on the layer 43. As indicated previously in regard to FIG. 1c, the material used may be ZnO. This layer 44 is optional.

Finally, a layer 45 of a transparent and conducting oxide is deposited on the layer 44.

This layer 45 can consist of Al-doped ZnO, this layer being deposited by cathodic sputtering.

The thickness of the layer 45 is between 100 and 800 nm and, preferably, equal to about 500 nm.

FIG. 2g illustrates a last step of the method, in which another etching is carried out in the stack of layers.

This etching step corresponds to step P3 and leads to the obtaining of an opening 412.

This opening 412 makes it possible to define two adjacent cells 5 and 6 and to insulate them electrically, at the level of their front-face electrodes 45a and 45b.

Generally, the indications given in respect of the implementation of the steps illustrated in FIGS. 1c, 1e and 1f are also valid in respect of steps illustrated in FIGS. 2e and 2f.

FIG. 2g also illustrates the path of the charges between two adjacent cells 5 and 6.

The front face electrode 45a of the first cell 5 makes it possible to collect, at the front face, the electrical charges generated in this cell 5 and to convey them to the rear face electrode 41b of the adjacent cell 6, through the conducting zone 460 of the layer 46.

Thus, the method which has just been described exhibits the advantage of eliminating the etching step P2, conventionally envisaged in the methods of monolithic interconnection, and therefore of circumventing the drawbacks related to this etching step.

Reference will now be made to FIGS. 3a to 3f which describe another mode of implementation of the method according to the invention.

As shown by FIG. 3a, in this mode of implementation, a layer 7 of selenium or sulfur is also deposited in a localized manner on the substrate 4.

Thus, at least one part 400 of the substrate is covered with a material of the type Se or S.

Of course, several parts of the substrate will be able to be covered with a material of the type Se or S, insofar as a plurality of photovoltaic cells are intended to be produced on the substrate 4.

In all cases, the parts 400 of the substrate which are covered with a material of the type Se or S are distinct from the parts 401 covered with a metal, such as copper.

The layer 7 can be deposited by various deposition methods and in particular those mentioned in respect of the layer 8, with regard to FIG. 2a.

FIG. 3b illustrates a method step similar to that illustrated in regard to FIG. 2b and in which a metallic layer 41 is deposited on the substrate.

This metallic layer covers the substrate uniformly and coats at one and the same time the localized metal layer 8 and the localized layer 7 of Se or S.

The stack illustrated in FIG. 3b constitutes an intermediate product which can be produced independently of the method steps which will be implemented subsequently.

FIG. 3c illustrates a method step similar to that illustrated in FIG. 2d and in which the precursors, which will lead to the formation of the photovoltaic layer, are introduced in the form of a layer 42.

FIG. 3d illustrates another step of the method in which at one and the same time the localized layer 7, the localized layer 8 and the layer 42 are transformed.

Firstly, a step of annealing at a moderate temperature is performed. This annealing step comprises a rise in temperature with ramps of less than or equal to 1° C./s and, preferably, of the order of 0.1° C./s, so as to attain a temperature of between 225 and 300° C. and, preferably, of the order of 250° C. The stack is subjected to this temperature for a duration of between 1 and 5 min.

This annealing step can be performed in a vacuum or in a neutral atmosphere.

Thus, the selenium of the localized layer 7 will react with the constituent material of the layer 41, insofar as the latter is made of molybdenum. $MoSe_2$ will then be formed in the layer 41, at the level of the part 400 of the substrate. The $MoSe_2$ grows in a hexagonal close packed structure whose c axis is parallel to the surface of the layer 41.

In another embodiment, it is the sulfur present in the layer 7 which reacts with the molybdenum layer 41 to form $MoS_2$.

The thickness of the molybdenum layer and the quantity of selenium or of sulfur, introduced by the layer 7, will be tailored so that the molybdenum is transformed into $MoSe_2$ or $MoS_2$, over the whole thickness of the layer 41.

Thus, by virtue of this annealing step, a zone 71 formed of $MoSe_2$ or $MoS_2$ is formed in the molybdenum layer 41.

By way of example, for a thickness of the molybdenum layer of about 500 nm, the thickness of the selenium layer 7 will be between 1 and 2 µm for a width of between 50 µm and 150 µm and preferably equal to 100 µm, depending on the porosity of the molybdenum layer, so as to correspond to the theoretical stoichiometry of the $MoSe_2$.

The resistivity of the $MoSe_2$ or of the $MoS_2$ in the direction parallel to the c axis is much greater than that of the molybdenum, the resistivity ratio being greater than $10^8$.

The zone 71 of the layer 41 therefore exhibits a greater resistivity than the remainder of the layer 41.

This zone 71 will thus make it possible to define the rear-face electrodes 41a and 41b of the two adjacent cells, referenced 5 and 6 in FIG. 3f, and to insulate them electrically. The formation of this zone 71 makes it possible to avoid the etching step P1 and therefore to eliminate the drawbacks related to this etching step.

Subsequent to this annealing step leading to the formation of the zone 71, the temperature of the substrate 4 is further increased so as to carry out a high-temperature annealing, as was described with reference to FIG. 2e, so as to convert the layer 42 into a layer 46 of photovoltaic material.

This annealing will not therefore be described again in detail.

Moreover, as described with reference to FIG. 2e, this annealing at a temperature of between 400 and 650° C., leads to the diffusion, through the layer 41, of the copper present in the localized layer 8 and to the formation of a zone 460 made of conducting material.

It should be noted that the diffusion of the copper through the layer 41 begins, in practice, during the annealing step leading to the formation of the zone 71.

However, this diffusion is relatively weak for temperatures of less than 400° C.

It should also be noted that with the method for forming CIGS described in document U.S. Pat. No. 5,578,503, the step of annealing at moderate temperature, leading to the formation of the zone 71, is indeed carried out after the deposition of the layer 42.

However, with the method described in document U.S. Pat. No. 5,436,204, this step of annealing at moderate temperature is carried out before the deposition of the layer 42.

FIGS. 3e and 3f describe steps of the method which are similar to those that were described in FIGS. 2f and 2g.

Thus, FIG. 3e shows that three layers are deposited on the layer 46: a layer 43 of n-type semiconductor, an optional layer 44 of a transparent material and finally a layer 45 of a transparent and conducting oxide.

FIG. 3f illustrates a last step of the method, in which an etching step corresponding to step P3 is carried out, leading to the obtaining of an opening 412.

Thus, this mode of implementation of the method according to the invention makes it possible to avoid at one and the same time the need to carry out an etching of the type P1 and an etching of the type P2.

Reference is now made to FIGS. 4 and 5 which illustrate two variants of a step of the method described with reference to FIGS. 3a to 3f. These variants correspond more specifically to the step illustrated in FIG. 3d.

In these variants, no annealing at moderate temperature (225-300° C.) is carried out allowing the constituent material of the layer 41 to react with the selenium or the sulfur of the layer 7 so as to create a zone 71 made of a conducting material, resulting from the reaction of the material of the layer 41 with Se or S.

This is why the constituent material of the layer 41 is not necessarily molybdenum. As indicated previously, this material may in particular be Ni, Pt or any other conducting material being deposited in columnar form and exhibiting a certain porosity.

Indeed, the porous and columnar character of the layer facilitates the diffusion of the Cu.

In these variants, the annealing is performed in such a way as to directly convert the metallic constituents present in the layer 42 into a photovoltaic material, by virtue of the introduction of Se or of S.

Thus, the annealing is typically carried out at a temperature of between 400 and 650° C., this temperature being attained with a temperature rise ramp of strictly greater than 1° C./s and possibly as much as 15° C./s. In a preferred manner, the temperature rise ramp is of the order of 10° C./s and the temperature is of the order of 500° C.

With steep temperature rise ramps, at the level of the part 400 of the substrate, the material of the layer 41 undergoes significant stresses on account of the expansion of the localized layer 7 made of selenium or sulfur.

These stresses lead to the local breakage of the layer 41 and therefore to the formation of a groove in this layer.

In the case of the method for forming CIGS described in document U.S. Pat. No. 5,436,204, the high-temperature annealing step is carried out during the deposition of the layer 42 comprising metallic precursors.

Thus, the annealing leads to the conversion of the layer 42 into the photovoltaic layer 46 and the breakage of the layer 41 leads to the formation, in this layer 41, of a zone 410 which is filled with photovoltaic material which is of the same nature as the material of the layer 46, with the exception of course of the conducting zone 460. This variant is illustrated in FIG. 4.

In the case of the method for forming CIGS described in document U.S. Pat. No. 5,578,503, the high-temperature annealing step is carried out after the deposition of the layer 42 comprising metallic precursors.

With steep temperature rise ramps, at the level of the part 400 of the substrate, the materials of the layer 41 and 42 undergo significant stresses on account of the expansion of the localized layer 7 made of selenium or sulfur.

These stresses lead to the local breakage of the layers 41 and 42 and therefore to the formation of a groove 461, devoid of conducting material and of photovoltaic material. This variant is illustrated in FIG. 5.

This annealing causes, as was described with reference to FIGS. 2e and 3d, the diffusion of the copper of the localized layer 8 through the layer 41 to form a zone 460 made of conducting material.

Thus, in these two variants, the electrical insulation between two adjacent cells of the photovoltaic module is also obtained by the method according to the invention, thereby further making it possible to eliminate the etching step P1.

It should be noted that the other steps of the method are not modified.

Reference is now made to FIG. 6 which illustrates a variant of another step of the method according to the invention, corresponding to FIG. 3e.

FIG. 6 shows that the semiconductor layer 43 is not deposited in a continuous manner on the photovoltaic layer 46. On the contrary, the layer 43 comprises discontinuities 430, at the level of the zones 460 of the photovoltaic layer 46.

The localized deposition of the layer 43 may, for example, be carried out by ink-jet. It exhibits the benefit, with respect to the embodiment illustrated in FIG. 3e, of avoiding the addition of a resistance which would stem from the presence of the layer 43, between the electrode 45a and the zone 460.

In a complementary manner, it should be noted that germanium may also be integrated into the lattice of the CZTS to form a material of $Cu_2Zn\,(Sn,Ge)\,(S,Se)_4$ type, when a mixture of selenium and sulphur is introduced.

The metallic constituents forming the layer 42 may also be of Cu, Al and In type.

The method according to the invention then leads to the obtaining of solar cells whose photovoltaic layer is made of a material of Cu (In, Al) (S, Se)$_2$ type.

The reference signs inserted after the technical characteristics featuring in the claims are aimed solely at facilitating the understanding of the latter and shall not limit the scope thereof.

The invention claimed is:

1. A method for obtaining a photovoltaic module comprising a plurality of solar cells in a structure in the form of thin layers, which successively comprises a substrate (4), a rear-face electrode (41), a photovoltaic layer (46) obtained by annealing on the basis of metallic precursors and a semiconductor layer (43), in which:
   an intermediate product is produced by a method comprising the following steps:
   (a) a localized deposition on and in direct contact with a substrate (4) of a first metal layer (8) so as to cover at least one first part (401) of the substrate, and the localized deposition of a second layer (7) of a material comprising Se or S on the substrate (4), so as to cover at least one second part (400) of the substrate, distinct from said at least one first part (401) covered with metal,
   (b) a deposition on said first localized metal layer (8) and said second layer (7), of a layer of metallic material (41) distinct from the first localized metal layer (8) and forming a rear-face electrode for various cells of the photovoltaic module, said layer of metallic material (41) coating the first localized metal layer (8) and the second layer (7) and being in direct contact with the substrate, said localized layer (8) being adapted to diffuse through said layer of metallic material (41);
   completion of an annealing step, which modifies said second localized metal layer (7) of material comprising Se or S so as to form, in the rear-face electrode (41), a zone (71, 410, 461) exhibiting a greater resistivity than the remainder of the rear-face electrode, said zone ensuring electrical insulation between two adjacent cells of the photovoltaic module;
   completion of the annealing leading to the obtaining of the photovoltaic layer (46), a zone (460) exhibiting a greater conductivity than the remainder of the photovoltaic layer is formed in the photovoltaic layer.

2. The method as claimed in claim 1, in which the other annealing step is carried out before the obtaining of the photovoltaic layer (46), with a temperature rise ramp of less than or equal to 1° C./s and at a temperature of between 225 and 300° C., for a duration of between 1 and 5 minutes, said zone (71) of the rear-face electrode being formed of a material resulting from the reaction of the conducting material with Se or S.

3. The method as claimed in claim 1, in which the annealing step is carried out during the obtaining of the photovoltaic layer (46), at a temperature of between 400 and 650° C., with temperature rise ramps of strictly greater than 1° C./s and possibly as much as 15° C./s.

4. The method as claimed in claim 3, in which said zone (410) is formed of photovoltaic material.

5. The method as claimed in claim 3, in which said zone (461) is a groove.

* * * * *